United States Patent [19]
Hashimoto

[11] Patent Number: 5,991,906
[45] Date of Patent: Nov. 23, 1999

[54] SEMICONDUCTOR INTEGRATED CIRCUIT DEVICE AND ITS TEST METHOD

[75] Inventor: Tsuneyuki Hashimoto, Oita, Japan

[73] Assignee: Kabushiki Kaisha Toshiba, Kawasaki, Japan

[21] Appl. No.: 09/009,257

[22] Filed: Jan. 20, 1998

[30] Foreign Application Priority Data

Jan. 20, 1997 [JP] Japan ..................................... 9-007749

[51] Int. Cl.⁶ .................................................. G01R 31/28
[52] U.S. Cl. ........................... 714/724; 714/819; 714/707
[58] Field of Search ..................................... 714/703, 704, 714/707, 724, 726, 731, 819

[56] References Cited

U.S. PATENT DOCUMENTS 5,371,773 12/1994 Ihara et al. ............................... 714/724
5,703,409 12/1997 Fukumitsu et al. ..................... 714/704

FOREIGN PATENT DOCUMENTS

63-186167  8/1988  Japan .

*Primary Examiner*—Trinh L. Tu
*Attorney, Agent, or Firm*—Foley & Lardner

[57] ABSTRACT

In a semiconductor integrated circuit device having a test circuit, the test time can be shortened and further the circuit activation ratio can be increased, while reducing the circuit scale. In the operation test mode, the counter circuit (10) is divided into the first counter circuit (10a) and the second counter circuit (10b) by use of the test circuit (20). Further, the same input count clock CK is inputted at the same time to both the first and second counter circuits (10a, 10b) in parallel. The normal operation of the counter circuit (10) can be discriminated by checking whether the output signal A of the first counter circuit (10a) matches the output signal B of the second counter circuit (10b) or not.

20 Claims, 13 Drawing Sheets

| MODE SETTING (CONTROL SIGNALS) | 1st SELECTOR (22) | 2nd SELECTOR (28) |
|---|---|---|
| OPERATION TEST MODE (TEST SIGNAL = 1) | SELECT INPUT COUNT CLOCK CK | SELECT OR ELEMENT OUTPUT |
| NORMAL OPERATION MODE (TEST SIGNAL = 0) | SELECT OUTPUT SIGNAL A | SELECT OUTPUT SIGNAL B |

| MODE SETTING (CONTROL SIGNALS) | 1st SELECTOR (a) (22a) | 1st SELECTOR (b) (22b) | 1st SELECTOR (c) (22c) | 1st SELECTOR (28) |
|---|---|---|---|---|
| OPERATION TEST MODE | SELECT INPUT COUNT CLOCK CK | SELECT INPUT COUNT CLOCK CK | SELECT INPUT COUNT CLOCK CK | SELECT SIGNAL J |
| NORMAL OPERATION MODE | SELECT SIGNAL E | SELECT SIGNAL F | SELECT SIGNAL G | SELECT SIGNAL H |

SEMICONDUCTOR INTEGRATED CIRCUIT DEVICE AND ITS TEST METHOD

BACKGROUND OF THE INVENTION

1. Field of the Invention

The present invention relates to a semiconductor integrated circuit device and its test method, and more specifically to a semiconductor integrated circuit device provided with both a counter circuit and a test circuit and its test method.

2. Description of the Prior Art

Figure 12:
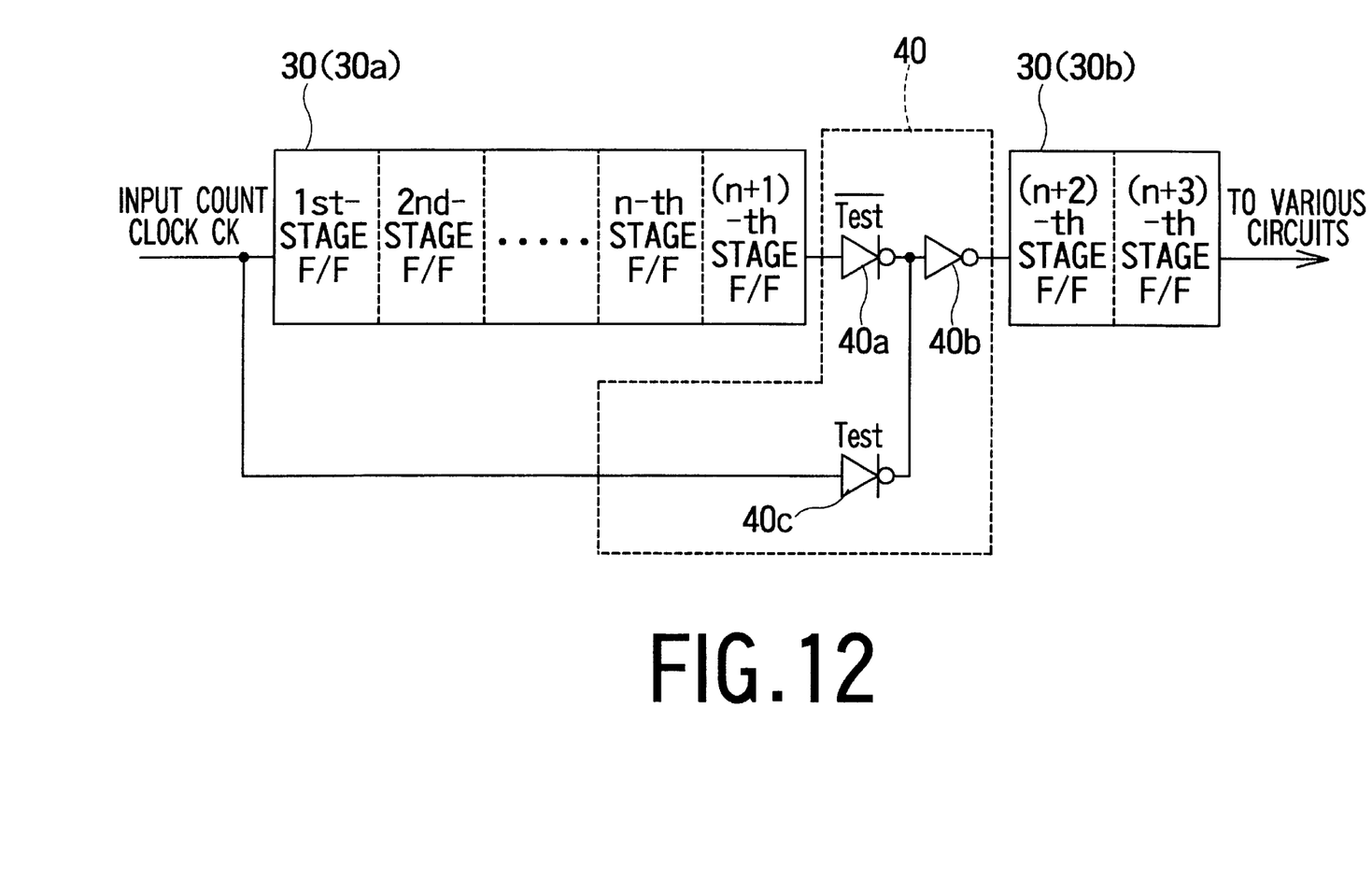
FIG. 12 is a circuit diagram showing a first example of the prior art semiconductor integrated circuit device.

FIG. 12 is a circuit diagram showing an example of the prior art semiconductor integrated circuit device having a counter circuit 30. The counter circuit 30 is composed of (n+3)-stage flip-flops. Further, a test circuit 40 composed of three inverters 40a to 40c is connected between the (n+1)-stage flip-flop and the (n+2)-stage flip-flop. In these three inverters, the two inverters 40a and 40b are those which can be switched (i.e., turned on or off) on the basis of two control signals TEST and /TEST, and the remaining inverter 40b is an ordinary inverter. In other words, this test circuit 40 is provided with such a function as to switch the semiconductor integrated circuit device from an ordinary operation mode to a test mode or vice versa, by turning the two inverters 40a and 40c on or off in response to the two control signals TEST and /TEST, respectively.

The operation of the prior art semiconductor integrated circuit device shown in FIG. 12 will be described hereinbelow.

In the ordinary operation mode in which the control signal is /TEST, the inverter 40a is turned on and the inverter 40c is turned off. Therefore, the (n+1)-stage flip-flop and the (n+2)-stage flip-flop are substantially connected to each other through the two inverters 40a and 40b of the test circuit 40. Therefore, an input count clock CK is inputted to the first stage flip-flop (on the left side in FIG. 12) of the counter circuit 30a, and a signal is outputted from the (n+3)-stage flip-flop (on the right side in FIG. 12) of the counter circuit 30b. In other words, the semiconductor integrated circuit device functions as a counter circuit having the (n+3)-stage flip-flops as a whole.

On the other hand, in the operation test mode in which the control signal is TEST, the inverter 40a is turned off and the inverter 40c is turned on. Therefore, the inputted count clock signal CK is directly inputted to the (n+2)-stage flip-flop connected midway of the counter circuit 30 through the two inverters 40c and 40b of the test circuit 40. That is, the inputted count clock CK is inputted to a first half counter circuit 30a and further to a second half counter circuit 30b. In this case, however, since the inverter 40a is kept turned off, the signal outputted by the (n+1)-stage flip-flop of the first counter circuit 30a is stopped, so that it is impossible to decide whether the counter circuit operates normally or not. On the other hand, the signal outputted from the (n+3)-stage flip-flop of the second counter circuit 30b is received by various circuits (not shown) connected on the output side of the second counter circuit 30b. Therefore, it is possible to check whether the operation of the counter circuit 30 is normal or not on the basis of a predetermined signal outputted by the counter circuit 30 and by use of a detecting circuit of these various circuits.

In the semiconductor integrated circuit device as shown in FIG. 12, since the operation test of the counter circuit 30 can be made as described above, it is possible to shorten the time required for the operation test of the circuit device.

Figure 13:
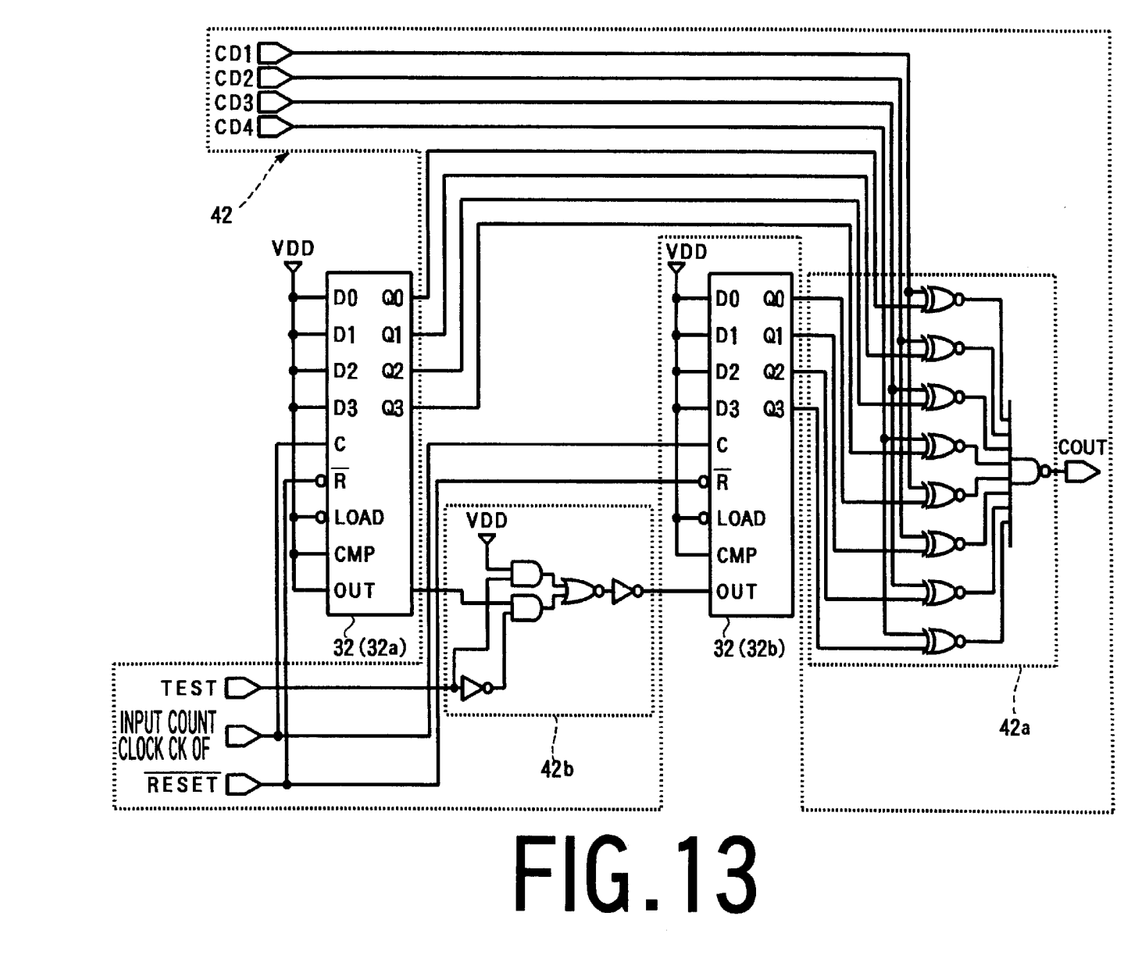
FIG. 13 is a circuit diagram showing a second example of the prior art semiconductor integrated circuit device.

FIG. 13 is a circuit diagram showing another prior art semiconductor integrated circuit device having a counter circuit 32, which is disclosed in Japanese Published Unexamined (Kokai) Patent Application No. 63-186167. The counter circuit 32 is composed of 8-stage flip-flops; in more detail, the counter circuit 32 is composed of a first counter circuit 32a including first half four-stage flip-flops and a second half counter circuit 32b including second half four-stage flip-flops. Here, the first counter circuit 32a and the second counter circuit 32b of the counter circuit 32 are divided by use of a dividing circuit 42b of a test circuit 42. The test circuit 42 is provided with such a function as to switch the ordinary operation mode to the operation test mode or vice versa.

The operation of the semiconductor integrated circuit device shown in FIG. 13 will be described hereinbelow. In the ordinary operation mode, the first half counter circuit 32a and the second half counter circuit 32b are connected to each other through the dividing circuit 42b. Therefore, an input count clock CK is applied to the first half counter circuit 32a and then derived from the second half counter circuit 32b. In other words, this semiconductor integrated circuit device can function as the counter circuit 32 having 8-stage flip-flops as a whole.

On the other hand, in the operation test mode, the counter circuit 32 is divided into the first half counter circuit 32a and the second half counter circuit 32b. Further, the input count clock CK is inputted to both the first and second counter circuits 32a and 32b at the same time. Here, each output of each flip-flop of the first and second counter circuits 32a and 32b is compared with a correct truth value for each clock by a comparison circuit 42a. These correct truth values are inputted through terminals CD1 to CD4 shown on the left side in FIG. 13. Therefore, it is possible to check whether the counter circuit 32 operates normally by checking whether all the outputs of all the flip-flops match the correct truth values, respectively.

In the semiconductor integrated circuit device as shown in FIG. 13, since the operation test of the counter circuit 32 can be made as described above, it is possible to shorten the time required for the operation test of the circuit device.

In the semiconductor integrated circuit device shown in FIG. 12, however, all the flip-flops of the counter circuit 30 are not activated in the operation test. In more detail, although the flip-flops for constituting the second half counter circuit 30b are all activated, the flip-flops for constituting the first half counter circuit 30b are not at all activated, so that the circuit activation ratio of the counter circuit 30 itself is relatively low. Therefore, in case any of the flip-flops for constituting the first half counter circuit 30a is defective, the defective flip-flop cannot be checked.

On the other hand, in the semiconductor integrated circuit device shown in FIG. 13, since all the flip-flops are activated, the circuit activation ratio is high. In the operation test mode, however, since each output of each flip-flop must be compared with each correct truth value for each input count clock CK by use of the comparison circuit 42a, a relatively large-scale comparison circuit 42a is required and thereby the circuit scale of the whole semiconductor integrated circuit device inevitably increases, thus resulting in a problem in that the device cost increases as a whole. In addition, since the terminals CD1 to CD4 must be provided for the circuit device to input the correct truth values from the outside, the number of steps for manufacturing the terminals increases.

SUMMARY OF THE INVENTION

With these problems in mind, therefore, it is the object of the present invention to provide a semiconductor integrated circuit device having a test circuit, by which the time required for the operation test can be shortened, while increasing the circuit activation ratio and decreasing the circuit scale.

To achieve the above-mentioned object, the present invention provides a semiconductor integrated circuit device, which comprises: a counter circuit composed of a plurality of series-connected flip-flops; and a test circuit for dividing said counter circuit into a plurality of counter circuit units during operation test of said counter circuit, inputting an input count clock to each of the divided counter circuit units, and comparing output signals of the divided counter circuit units each of which counts the inputted count clock mutually, to detect whether the output signals thereof match one another.

Further, the present invention provides a semiconductor integrated circuit device, which comprises: a counter circuit composed of n-units of flip-flops, where n is a positive integer; dividing means for dividing said counter circuit composed of n-units of the flip-flops into m-units of counter circuit units each composed of a-units of flip-flops during operation test of said counter circuit, where a and m are positive integers; m≧2; and n=a×m; inputting means for inputting an input count clock to each of the m-units of the divided counter circuit units substantially at the same time during the operation test of said counter circuit, but the input count clock only to the first-stage counter circuit unit during ordinary operation of said counter circuit; and comparing means for comparing output signals of m-units of the counter circuit units one another during the operation test of said counter circuit.

Further, the present invention provides a method of testing a semiconductor integrated circuit device, which comprises the steps of: dividing a circuit composed of n-units of flip-flops operable as a counter circuit during ordinary operation, into m-units of counter circuit units each composed of a-units of flip-flops during operation test, where n, a and m are positive integers, respectively; m≧2; and n=a×m; inputting an input count clock to m-units of the counter unit circuits substantially at the same time; and comparing the output signals of m-units of the counter circuit units one another for operation test of the counter circuit.

DETAILED DESCRIPTION OF THE PREFERRED EMBODIMENTS

Embodiments of the semiconductor integrated circuit device according to the present invention will be described hereinbelow with reference to the attached drawings.

Figure 1:
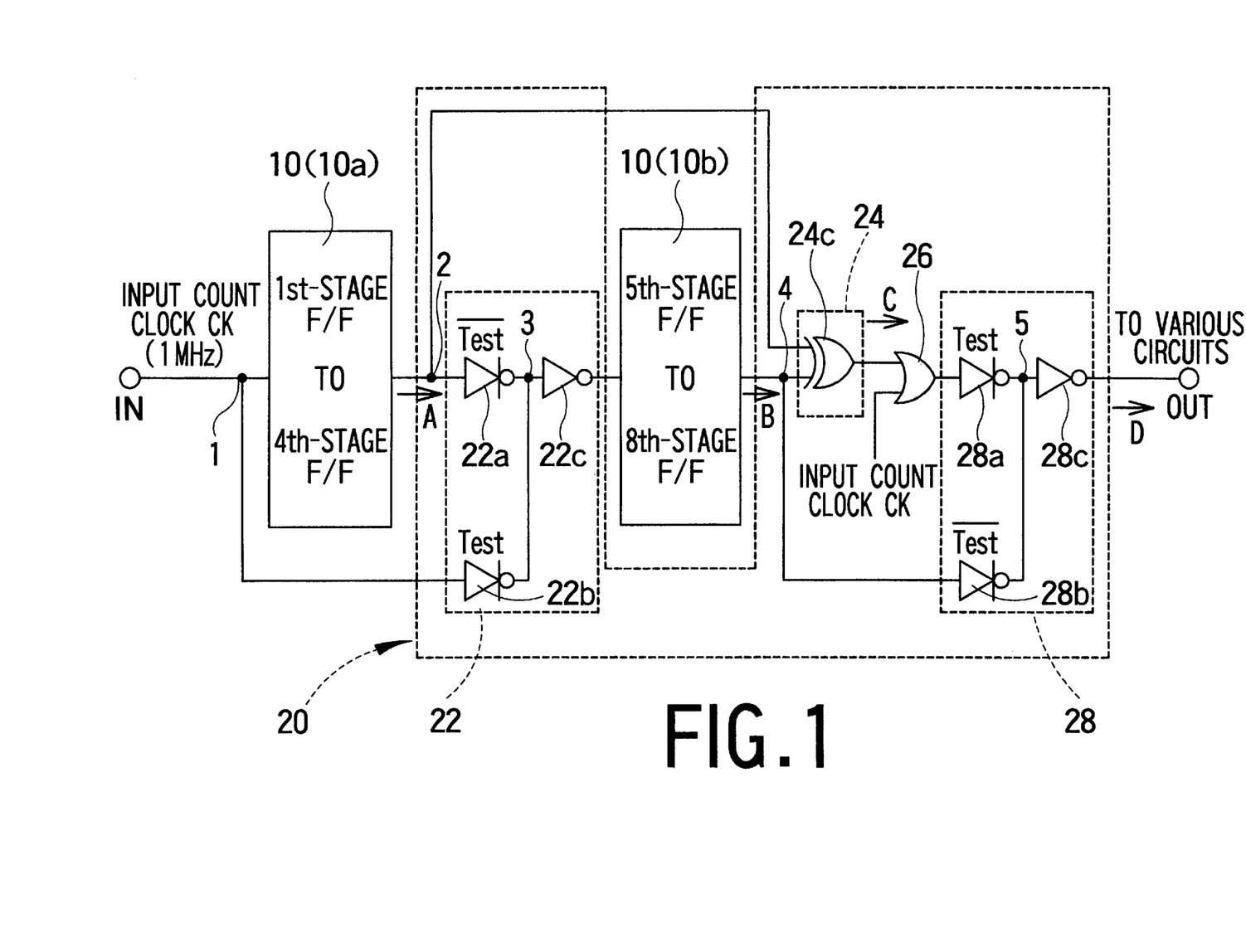
FIG. 1 is a circuit diagram showing a first embodiment of the semiconductor integrated circuit device according to the present invention.
Figure 2:
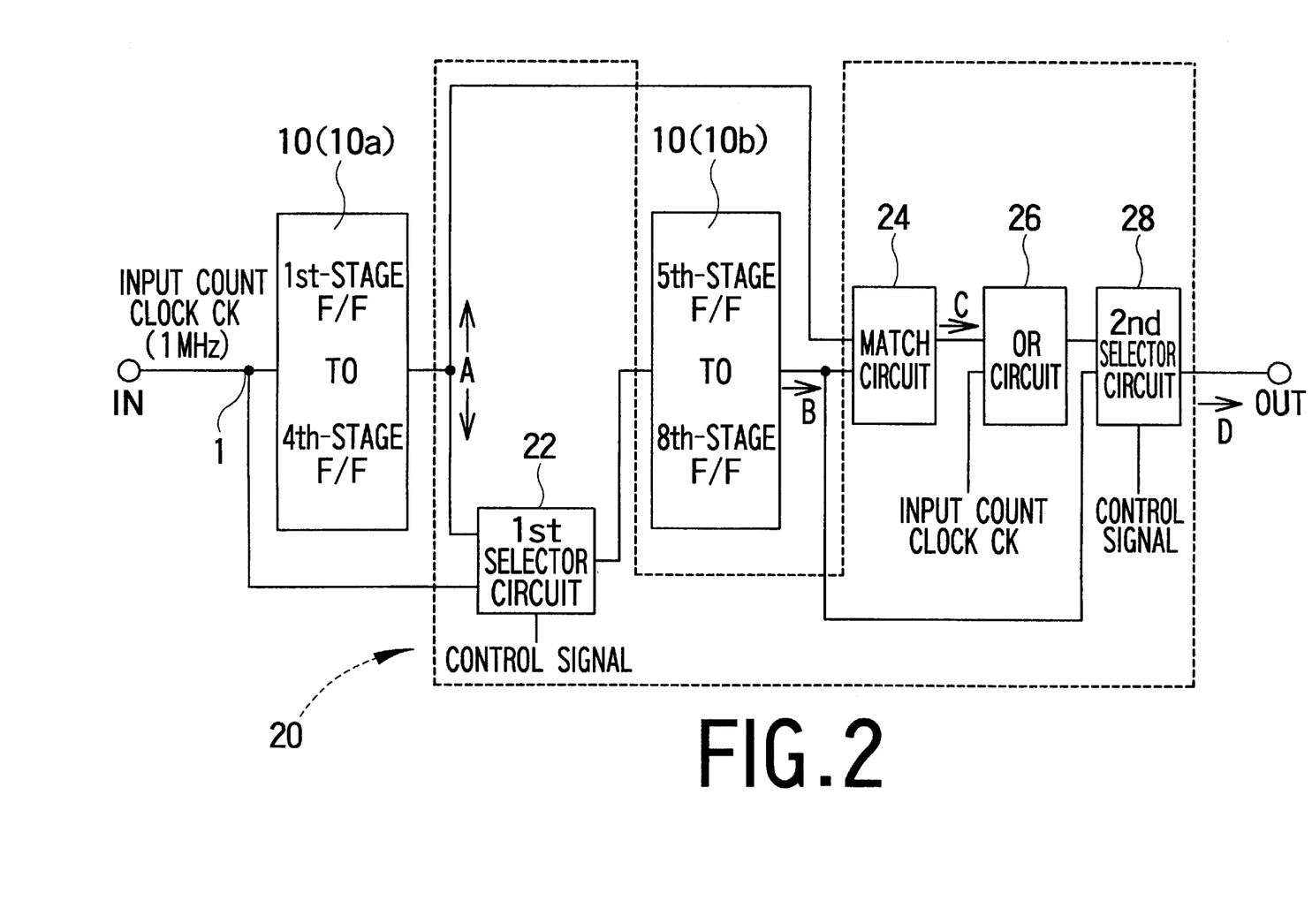
FIG. 2 is a block diagram showing the same first embodiment of the semiconductor integrated circuit device according to the present invention.
Figure 3:
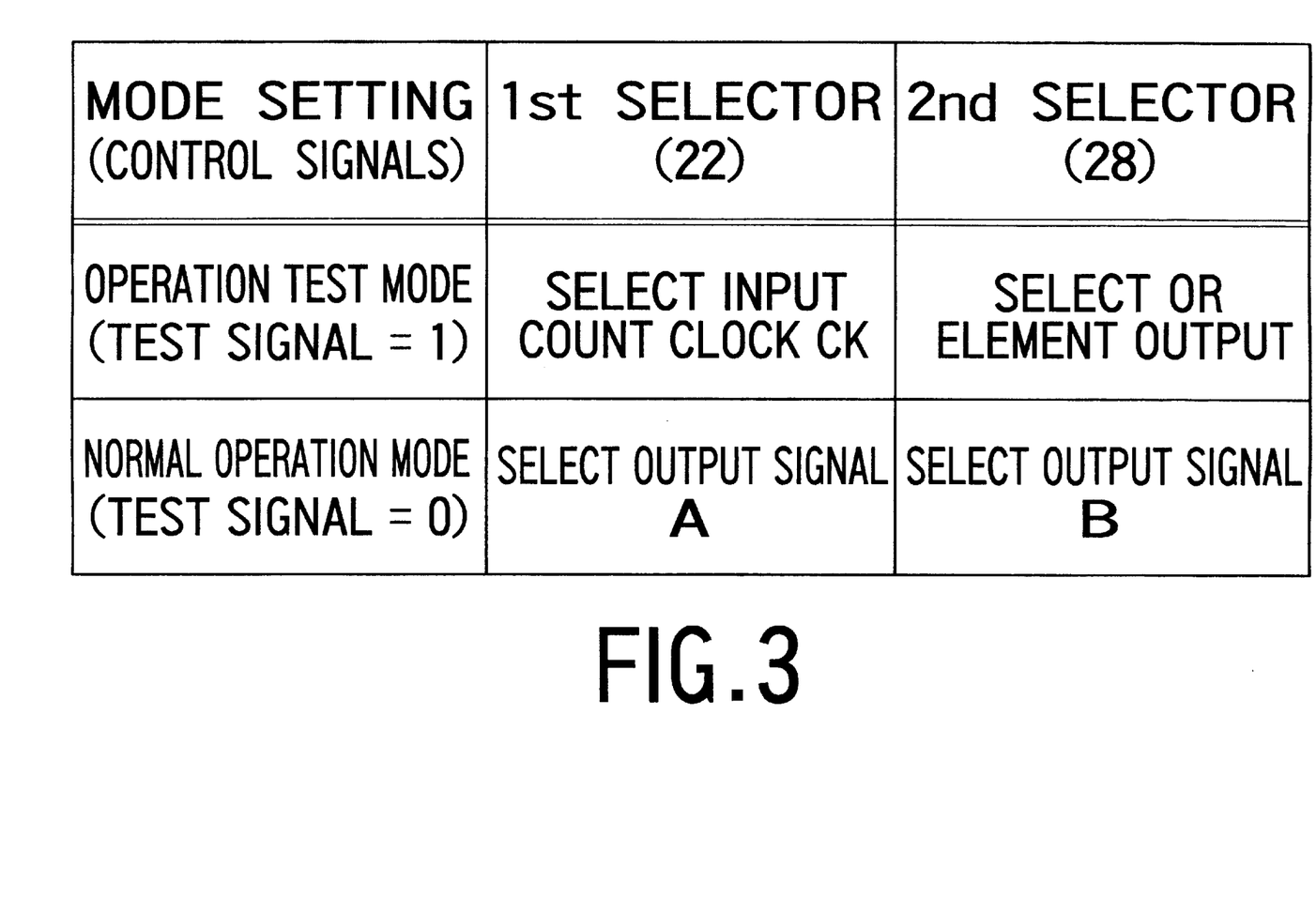
FIG. 3 is a table listing the set modes of a selector circuit.

FIG. 1 is a circuit diagram showing a first embodiment thereof; FIG. 2 is a block diagram showing the same first embodiment thereof; and FIG. 3 is a table which lists the selections of signals in both the operation test mode and the ordinary operation mode of first and second selector circuits shown in FIGS. 1 and 2, respectively.

In FIG. 2, the first embodiment of the semiconductor integrated circuit device is composed of a counter circuit 10 of 8-stage flip-flops and a test circuit 20 for testing the operation of this counter circuit 10. Further, the counter circuit 10 comprises a first counter circuit 10a of a first half 4-stage counter circuit unit, a second counter circuit 10b of a second half 4-stage counter circuit unit, and a first selector circuit 22 connected between the first and second counter circuits 10a and 10b. Further, the circuit device is provided with an input terminal IN on the left side in FIG. 2, through which an input counter clock CK is inputted. This input terminal IN is connected to both the first counter circuit 10a and the first selector circuit 22. Further, an output line (signal A) of the first counter circuit 10a is connected to the first selector circuit 22 and a match circuit 24. This selector circuit 22 is a circuit for selecting any one of the two input signals In and A. Further, an output line of this first selector circuit 22 is connected to the second counter circuit 10b. Further, an output line (signal B) of the second counter circuit 10b is connected to the match circuit 24 and a second selector circuit 28. Further, an output line (signal C) of the match circuit 24 is connected to an OR circuit 26. To this OR circuit 26, the input count clock CK is also inputted. Therefore, the OR circuit 26 outputs an ORed signal of these two signals CK and C. Further, an output line of the OR circuit 26 is connected to the second selector circuit 28. In the same way as with the case of the first selector circuit 22, the second selector circuit 28 is a circuit for selecting any one of the two input signals (B and ORed signal) in response to a control signal inputted thereto. An output line of the second selector circuit 28 is connected to an output terminal OUT to output a signal D.

The above-mentioned first embodiment of the semiconductor integrated circuit device is described in further detail with reference to FIG. 1.

The input count clock CK is inputted to the input terminal IN (shown on the left side) of the counter circuit 10. In operation test mode, the counter circuit 10 is divided into the first counter circuit 10a and the second counter circuit 10b by the test circuit 20. Here, the number of the flip-flop stages is the same (four stages) in both the first and second counter circuits 10a and 10b. In other words, the first counter circuit 10a is composed of four (first to fourth) stage flip-flops, and the second counter circuit 10b is composed of four (fifth to eighth) stage flip-flops.

Here, although the counter circuit 10 is divided by the test circuit 20 as described above; in more detail, the counter circuit 10 is divided by the first selector circuit 22 of the test circuit 20. Here, the first selector circuit 22 is composed of three inverters 22a, 22b and 22c. The inverter 22a is connected to the output line of the first counter circuit 10a; the inverter 22b is connected to a signal line extended from the input terminal (input count clock CK) and branched from a junction point 1. Here, these two inverters 22a and 22b are elements for setting the mode of the first selector circuit 22. In more detail, in the operation test mode, the inverter 22b is selected, so that the output signal of the inverter 22a is stopped from being outputted. In the ordinary operation mode, the inverter 22a is selected, so that the output signal of the inverter 22b is stopped from being outputted. The output lines of the two inverters 22a and 22b are coupled with each other at a junction point 3, and then connected to the inverter 22c. The output line of the inverter 22c is connected to the second counter circuit 10b of the second half counter circuit unit.

As described already, the output signal B is outputted by the second counter circuit 10b composed of the four-stage flip-flops. The output line of the second counter circuit 10b is connected to the match circuit 24.

The match circuit 24 is comparing means of this first embodiment, which is an exclusive OR element 24c. The output line branched from the junction point 2 is connected to one of the two input terminals of the exclusive OR element 24c, and the output line of the second counter circuit 10 is connected to the other of the two input terminals thereof. Therefore, the exclusive OR circuit 24c outputs an output signal C indicative of an exclusive OR of both the output signal A of the first counter circuit 10a and the output signal B of the second counter circuit 10b. An output line of the exclusive OR element 24c is connected to an OR element 26.

Further, the signal line extending from the input count clock CK is also connected to the OR element as shown. Therefore, the OR element 26 outputs an OR signal of the input count clock CK and the output signal C of the exclusive OR circuit 24c. The output line of the OR element 26 is connected to the second selector circuit 28. Further, instead of the OR element 26, it is possible to use another logic circuit which can input both a signal corresponding to the input count clock CK and the output signal C and output a logic signal corresponding thereto.

The second selector circuit 28 is composed of three inverters 28a, 28b and 28c, which is the same in construction as the first selector element. In more detail, the output line of the OR element 26 is connected to the inverter 28a, and the output line of the second counter circuit 10b (branched from a junction point 4) is connected to the inverter 28b. These two inverters 28a and 28b are used to set the mode of the second selector circuit 28. Therefore, in the operation test mode, the inverter 28a is selected, so that the output signal of the inverter 28b is stopped from being outputted. In the ordinary operation mode, on the other hand, the inverter 28b is selected, so that the output signal of the inverter 28a is stopped from being outputted. The two output signals of the two inverters 28a and 28b are coupled with each other at a junction point 5, and then connected to the inverter 28c. The inverter 28c outputs an output signal D through an output line connected to various circuits (not shown).

Figure 6:
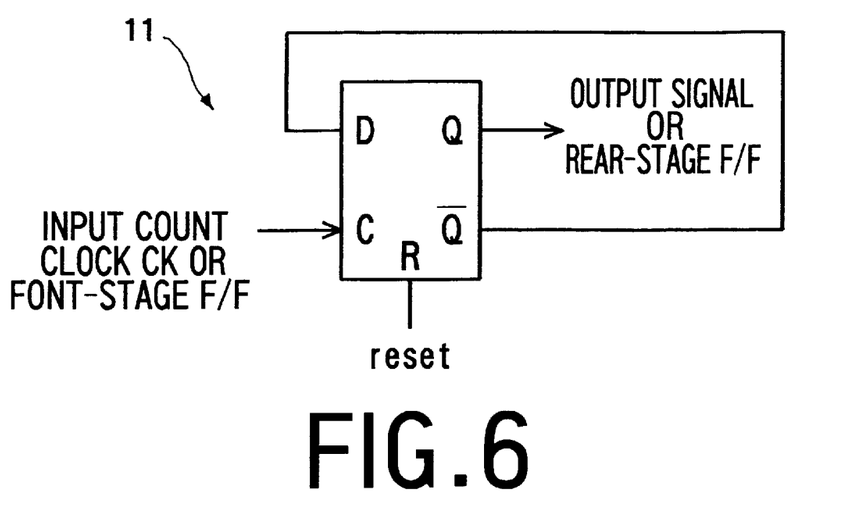
FIG. 6 is a block diagram showing only a single stage flip-flop.

FIG. 6 is a circuit diagram showing the above-mentioned one-stage flip-flop, which is of D-type flip-flop as understood by FIG. 6. The input count clock CK or the output signal of the preceding stage flip-flop is inputted to a terminal C of the D-type flip-flop 11. Further, a signal of a terminal /Q is inputted to a D terminal. Further, a signal of a terminal Q is outputted as an output signal of the counter circuit 10a or 10b, or inputted to the terminal C of the succeeding stage D-type flip-flop 11.

Figure 7:
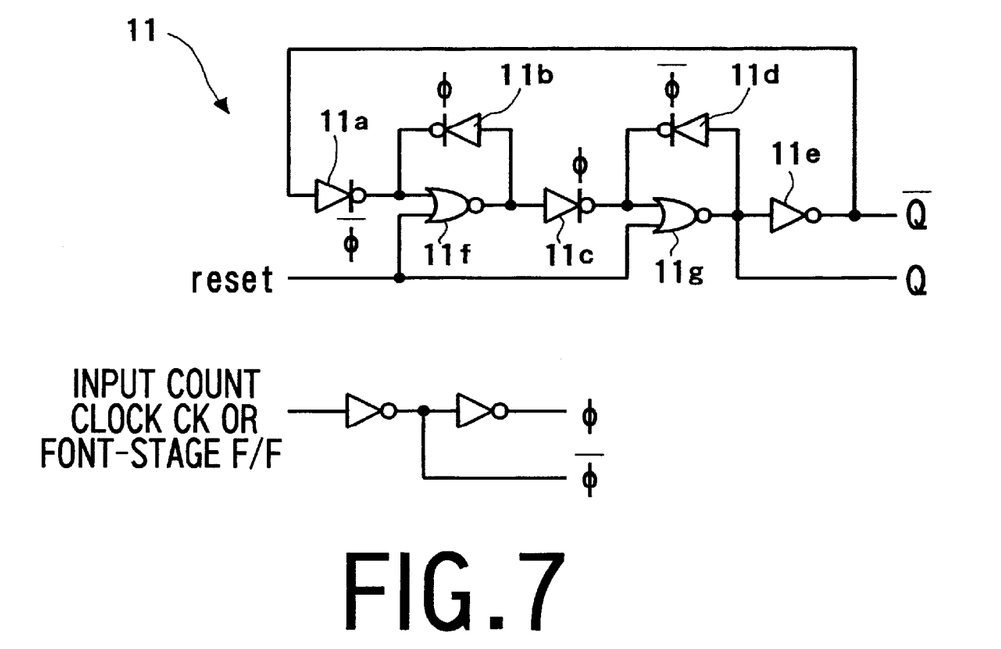
FIG. 7 is a circuit diagram showing an example of the flip-flop circuit shown in FIG. 6.

FIG. 7 is a circuit diagram showing an example of the practical D-type flip-flop 11, which is composed of five inverters 11a to 11e and two NOR circuits 11f and 11g. Here, the inverters 11b and 11c and the inverters 11a and 11d of these five inverters 11a to 11e are constructed in such a way that any one of the two inverters transmits a signal according to the input signal applied to the terminal C of the D-type flip-flop 11. In other words, when the two inverters 11b and 11c transmit signals, the signals of the two inverters 11a and 11d are stopped from being transmitted. On the other hand, when the two inverters 11a and 11d transmit signals, the signals of the two inverters 11b and 11c are stopped from being transmitted. The above-mentioned signal control can be made alternatively according to the input signal. Therefore, the circuit as shown in FIG. 7 can function as a D-type flip-flop circuit.

Ordinary Operation

The operation of the above-mentioned semiconductor integrated circuit device will be described hereinbelow. First, the ordinary operation will be explained on the basis of FIGS. 1 and 3.

As understood with reference in FIG. 1 in particular, the input count signal CK is inputted to the first counter circuit 10a of the counter circuit 10. Here, since the first counter circuit 10a is constructed by the four-stage flip-flops as described above, whenever 16 input count clocks CK are counted, the signal level of the output signal A exchanges a high (H) level and a low (L) level.

Under these conditions, as understood in FIG. 3, since the set mode is the ordinary operation mode, the first selector circuit 22 selects the output signal A. Therefore, as understood by FIG. 1, the output signal A is passed through the two inverters 22a and 22b, so that the phase of the output signal A is inverted twice into the original phase, and then inputted to the second counter circuit 10b.

Further, since the second counter circuit 10b is constructed by the four-stage flip-flops as described above, whenever 16 output signals A are counted, the signal level of the output signal B exchanges the H level and the low level.

Under these conditions, as understood in FIG. 3, since the set mode is the ordinary operation mode, the second selector circuit 28 selects the output signal B. Then, as understood by FIG. 1, since the output signal B is passed through the inverter 28b, the junction point 5 and the inverter 28c by way of the output line branched from the junction point 4. Since the output signal B is passed through the two inverters 28b and 28c as described above, the phase of the output signal B is inverted twice into the original phase, and then outputted as the output signal D from the semiconductor integrated circuit device.

As described above, the semiconductor integrated circuit device of the first embodiment can function as the counter circuit 10 composed of eight-stage flip-flops in the ordinary operation.

Operation Test in Normal Operation

Figure 4:
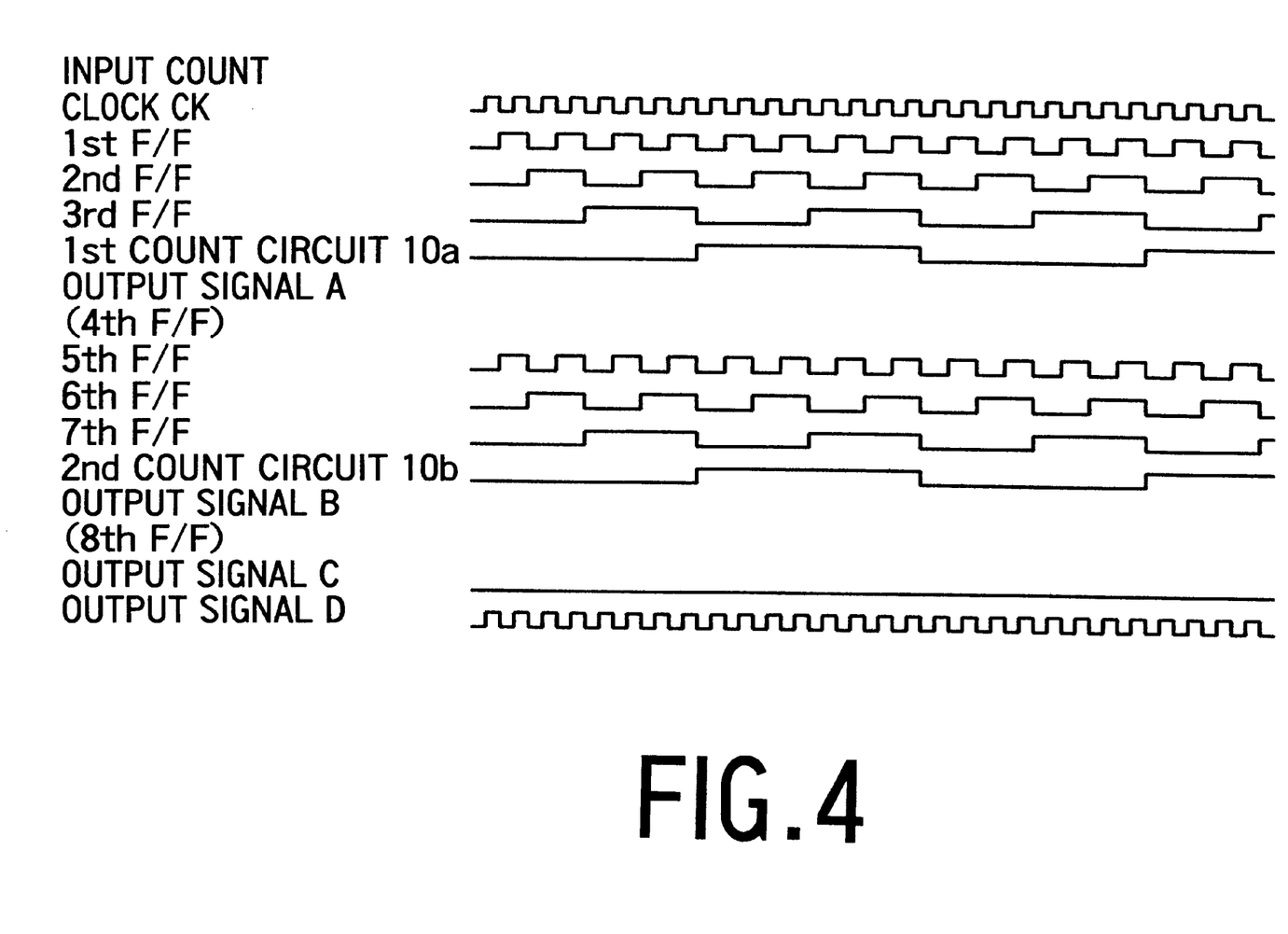
FIG. 4 is a waveform diagram showing various pulses obtained when the circuit device is operating normally in the operation test mode.

The normal operation in the operation test mode of the above-mentioned semiconductor integrated circuit device will be described hereinbelow on the basis of FIGS. 1, 3 and 4.

As understood with reference to in FIG. 1 in particular, the input count signal CK is inputted to the first counter circuit 10a of the counter circuit 10. Here, since the first counter circuit 10a is constructed by the four-stage flip-flops as described above, whenever 16 input count clocks CK are counted, the signal level of the output signal A changes from the L level to the H level.

Under these conditions, as understood in FIG. 3, since the set mode is the operation test mode, the first selector circuit 22 selects the input count clock CK. Therefore, as understood by FIG. 1, since the input count clock CK is directly inputted to the second counter circuit 10b through the junction point 1, the inverter 22b, the junction point 3 and the inverter 22c, the fifth stage flip-flop of the second count circuit 10b is driven directly by the input count clock CK as understood by FIG. 4. In other words, the fifth stage flip-flop of the second count circuit 10b operates in the same way as with the case of the first stage flip-flop of the first counter circuit 10a. At the same time, the six stage, the seventh stage, and the eighth stage of the flip-flops of the second counter circuit 10b operate in the same way as with the case of the second stage, the third stage and the fourth stage flip-flops of the first counter circuit 10a, respectively.

Therefore, as long as the counter circuit operates normally, the output signal A of the first counter circuit 10a matches the output signal B of the second counter circuit 10b. These two output signals A and B are compared with each other by the match circuit 24. Here, since the match circuit 24 is exclusive OR element as already explained, as understood by FIG. 4, when the two output signals A and B match with each other, the signal level of the output signal C of the match circuit 24 is kept at the L level.

Therefore, as long as the signal level of the output signal C is kept at the L level, the OR element 26 responsive to the output signal C outputs the count signal of the input count clock CK to the second selector circuit 28, as it is.

Under these conditions, as understood by FIG. 3, since the set mode of the second selector circuit 28 is in the operation test mode, the second selector circuit 28 selects the output of the OR element 26. Therefore, as understood by FIG. 1, the count signal outputted by the OR element 26 is outputted as the output signal D through the inverter 28a, the junction point 5, and the inverter 28c. Here, since being passed through the two inverters 28a and 28c, the phase of the count signal outputted by the OR element 26 is inverted twice into the original phase, and then outputted as the output signal D from the semiconductor integrated circuit device. Therefore, as understood by FIG. 4, the period of the output signal D is the same as that of the input count clock CK.

The output signal D of the semiconductor integrated circuit device is inputted to various circuits (not shown). That is, the output signal D is outputted from an external terminal, as it is, through these circuits. Or else, the output signal D is once inputted to another shift register circuit, and then an output signal of the shift register circuit is outputted through an external terminal. Therefore, the operation of the semiconductor integrated circuit device can be checked whether normal or abnormal, by checking whether the waveform of the output signal of the external terminal is a waveform to be expected or not.

Operation Test in Abnormal Operation

Figure 5:
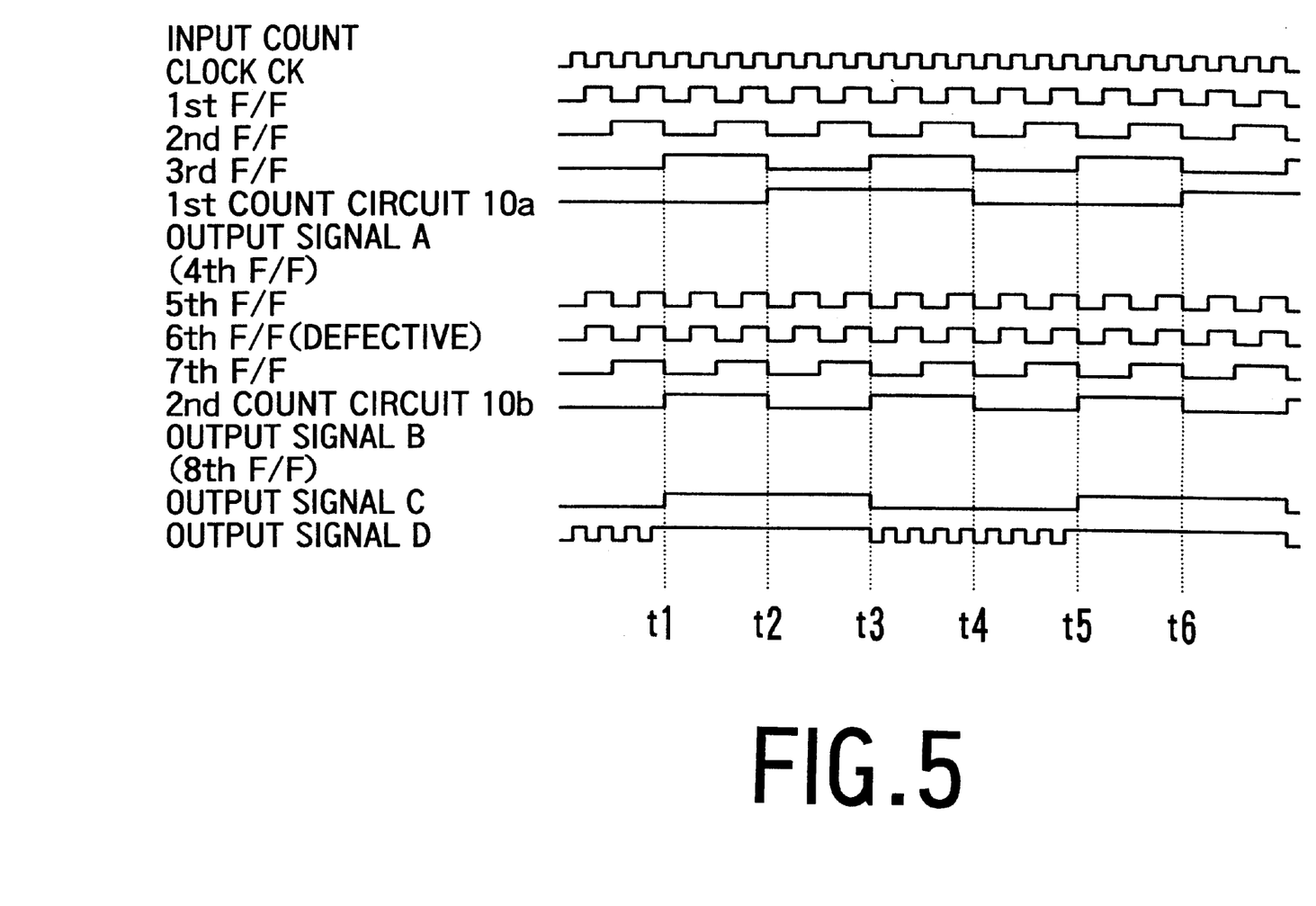
FIG. 5 is a waveform diagram showing various pulses obtained when the circuit device is operating abnormally in the operation test mode.

The abnormal operation in the operation test mode of the above-mentioned semiconductor integrated circuit device will be described hereinbelow on the basis of FIGS. 1, 3 and 5. Here, the case where the six stage flip-flop of the second counter circuit 10b is defective will be explained by way of example.

As understood with reference to in FIG. 1 in particular, the input count signal CK is inputted to the first counter circuit 10a of the counter circuit 10. Here, since the first counter circuit 10a is constructed by the four-stage flip-flops as described above, whenever 16 input count clocks CK are counted, the signal level of the output signal A changes from the L level to the H level, as shown in FIG. 5.

On the other hand, as already explained, since the set mode of the first selector circuit is the operation test mode, the first selector circuit 22 selects the input count clock CK. Therefore, the input count clock CK is directly inputted to the second counter circuit 10b. Under these conditions, since the six stage flip-flop of the second counter circuit 10b is defective, as understood by FIG. 5, when the eight input count clocks CK have been counted, the output signal B of the second counter circuit 10b changes from the L level to the H level.

As understood by FIG. 1, the two output signals A and B are inputted to the match circuit 24. Here, as understood by FIG. 5, since the output signal A does not match the output signal B during a period between time t1 and time t3, the L level of the output signal C of the match circuit 24 cannot be kept; that is, changes to the H level. Therefore, the output signal of the OR element 26 changes to the H level during a period between time t1 and t3. As understood by FIG. 1, the output signal of the OR element 26 is inputted to the second selector circuit 28. Here, since the set mode of the second selector circuit 28 is the operation test mode, the second selector circuit 28 selects the output of the OR element 26. Therefore, the output signal of the OR element 26 is outputted as the output signal D. Here, during the period between time t1 and time t3 (in which the two output signals A and B do not match each other), the output signal D is kept at the H level as shown in FIG. 5.

The output signal D of the semiconductor integrated circuit device is inputted to various circuits (not shown), and then outputted from the external terminal as it is. Or else, the output signal D is outputted from the output terminal through the shift register. Therefore, some trouble (defective flip-flop) of the semiconductor integrated circuit device can be checked by detecting that a signal having an expect waveform is not outputted through the output terminal; that is, by detecting that the output signal D is kept at the H level.

As described above, in the semiconductor integrated circuit device according to the present invention, since the counter circuit 10 is divided into the first counter circuit 10a and the second counter circuit 10b, it is possible to reduce the number of the patterns required for the operation test of the counter circuit 10 composed of eight-stage flip-flops down to 16 ($=2^4$) in total, in comparison with the conventional counter circuit in which the number of patterns is 256 ($=2^8$). In addition, since all the flip-flops from the first stage to the eighth stage are all activated, it is possible to maintain the circuit activation ratio at a high level.

For instance, in the case where the operation test of the counter circuit 10 not divided into two counter circuits is performed by use of the input count clock CK of 1 MHz, the required test time is 1 $\mu s \times 256 = 256$ $\mu s$. In comparison with this, in the case where the operation test is performed by dividing the counter circuit 10 into two counter circuits, the required test time is 1 $\mu s \times 16 = 16$ $\mu s$, so that the test time can be shortened down to 1/16 of the conventional counter circuit as a whole.

Further, in the semiconductor integrated circuit device according to the present invention, since the normal operation of the counter circuit 10 divided into the first counter circuit 10a and the second counter circuit 10b is discriminated by checking whether the two output signals A and B of the two divided counter circuits 10a and 10b match with each other, it is unnecessary to provide the comparison circuit for comparing the outputs of all the flip-flops with the truth values (being different from the conventional counter circuit), with the result that it is possible to compact the circuit scale of the semiconductor integrated circuit device and thereby to reduce the cost thereof. In addition, since the terminals for inputting the correct truth values from the outside are not required, the number of manufacturing steps can be reduced.

Figure 8:
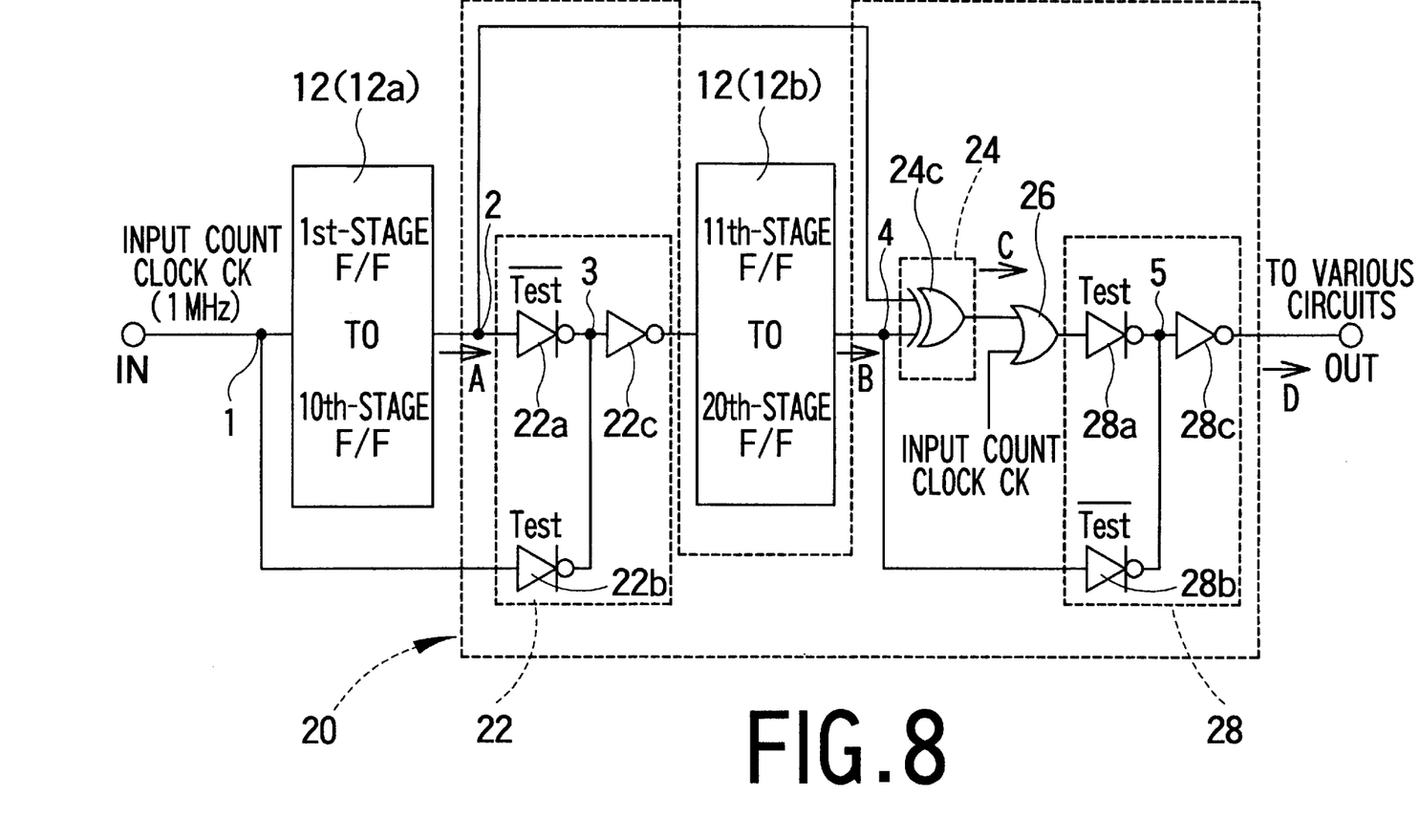
FIG. 8 is a circuit diagram showing a second embodiment of the semiconductor integrated circuit device according to the present invention.

A second embodiment of the semiconductor integrated circuit device according to the present invention will be described hereinbelow with reference to FIG. 8. The second embodiment is the same as with the case of the first embodiment, except that a counter circuit 12 of this embodiment is composed of 20-stage flip-flops in total. Therefore, the same reference numerals have been retained for similar circuit elements which have the same functions.

In more detail, in this second embodiment, a counter circuit 12 composed of 20-stage flip-flops in total is divided into a first counter circuit 12a composed of a 10-stage first half flip-flips and a second counter circuit 12b composed of a 10-stage second half flip-flips. Therefore, it is possible to reduce the number of the patterns required for the operation test of the counter circuit 12 composed of 20-stage flip-flops in total down to 1024 ($=2^{10}$), in comparison with the conventional counter circuit in which the number of patterns is 1048576 ($=2^{20}$) in total.

For instance, in the case where the operation test of the counter circuit 12 not divided into two counter circuits is performed by use of the input count clock CK of 1 MHz, the required test time is 1 $\mu s \times 1048576 = 1.049$ sec. In comparison with this, in the case where the operation test is performed by dividing the counter circuit 12 into two counter circuits, the required test time is 1 $\mu s \times 1024 = 1.024$ ms, so that the test time can be shortened down to 1/1000 of the conventional counter circuit as a whole.

Further, in the same way as with the case of the first embodiment, since the normal operation of the counter circuit 12 divided into the first counter circuit 12a and the second counter circuit 12b is discriminated by checking whether the two output signals A and B of the two divided counter circuits 12a and 12b match with each other, it is unnecessary to provide the comparison circuit for comparing the outputs of all the flip-flops with the truth values (being different from the conventional counter circuit), with the result that it is possible to compact the circuit scale of the semiconductor integrated circuit device and thereby to reduce the cost thereof. In addition, since the terminals for inputting the correct truth values from the outside are not required, the number of manufacturing steps can be reduced.

Figure 9:
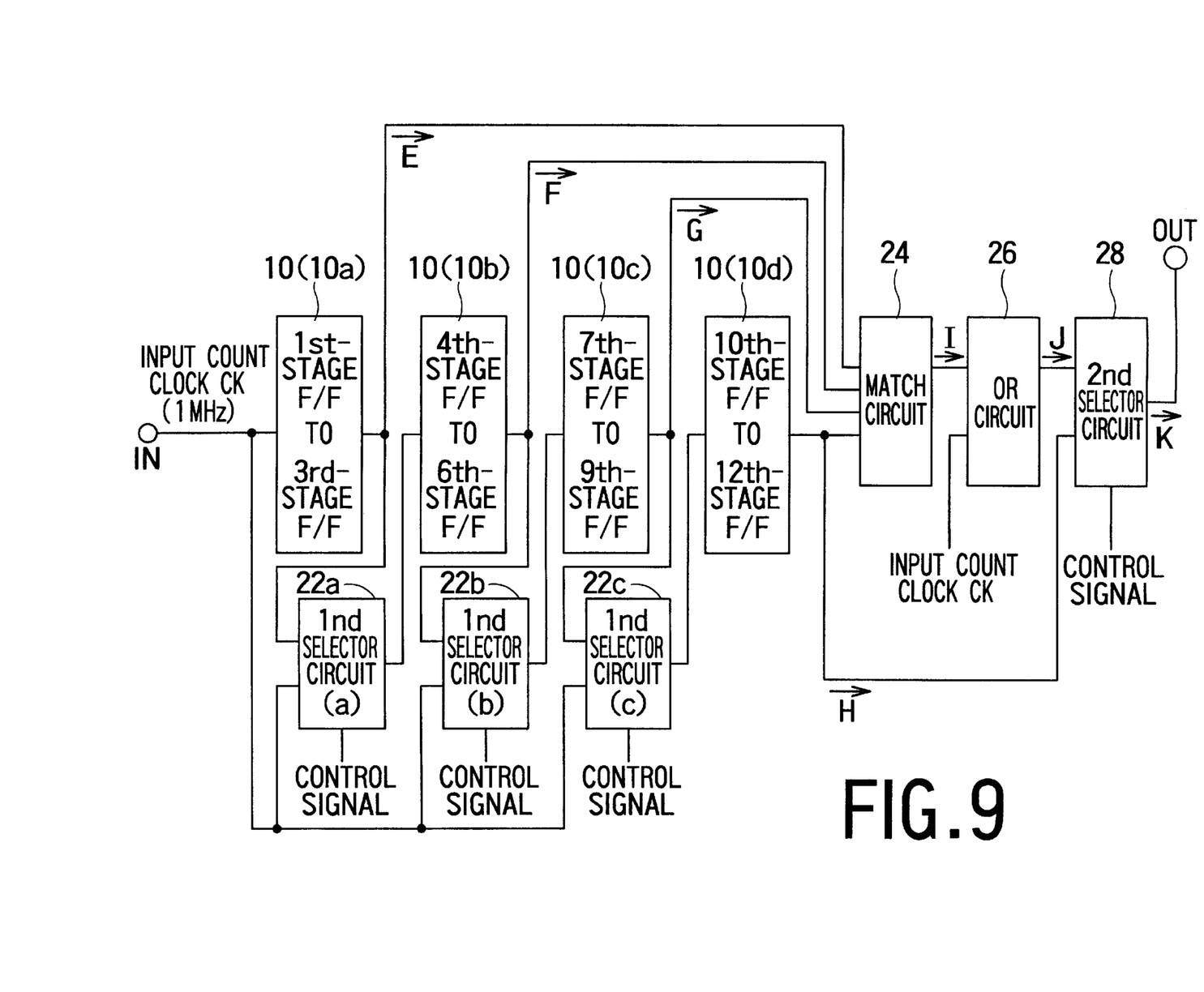
FIG. 9 is a circuit diagram showing a modification of the embodiments of the semiconductor integrated circuit device according to the present invention.
Figure 10:
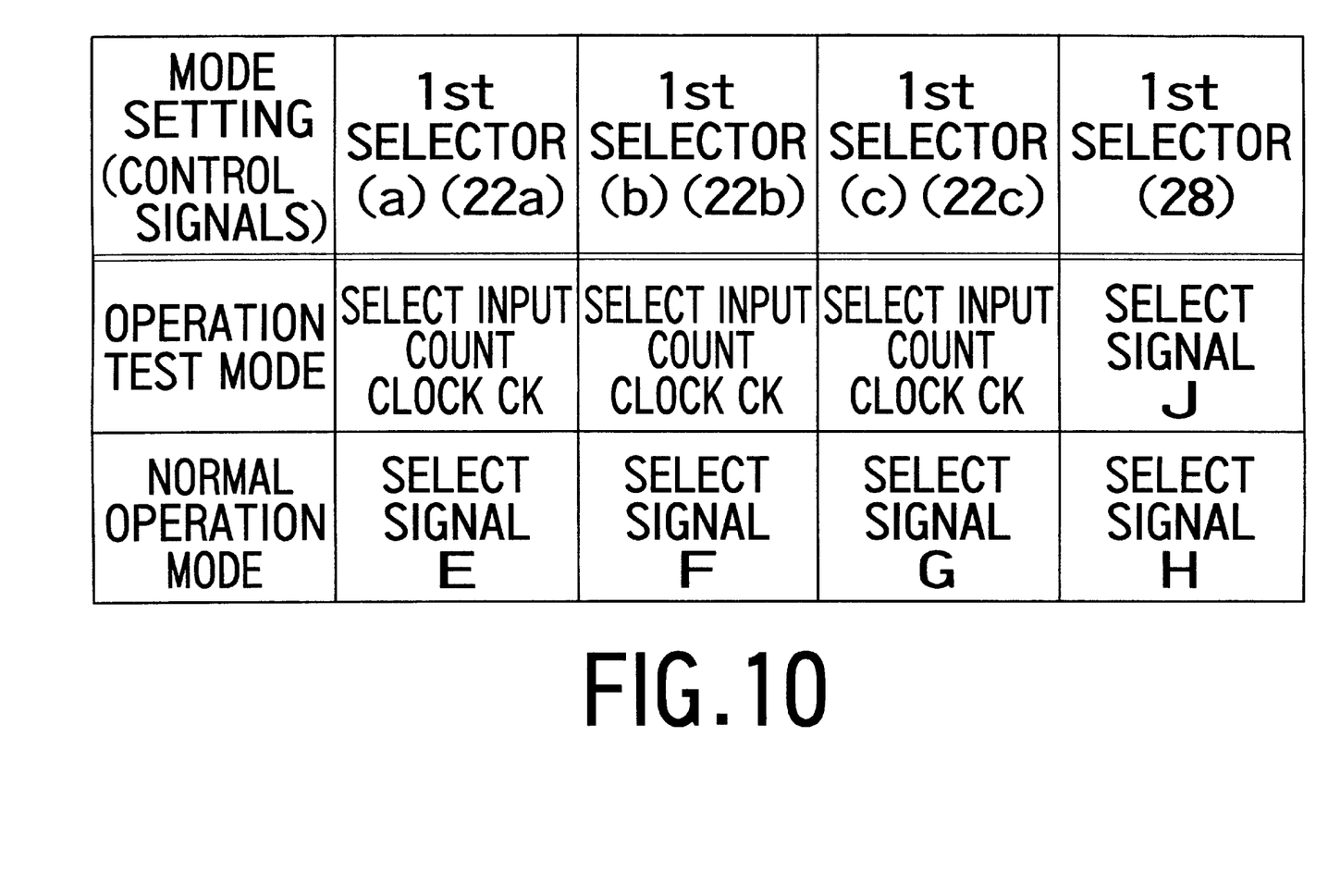
FIG. 10 is another table listing the set modes of the selector circuit.
Figure 11:
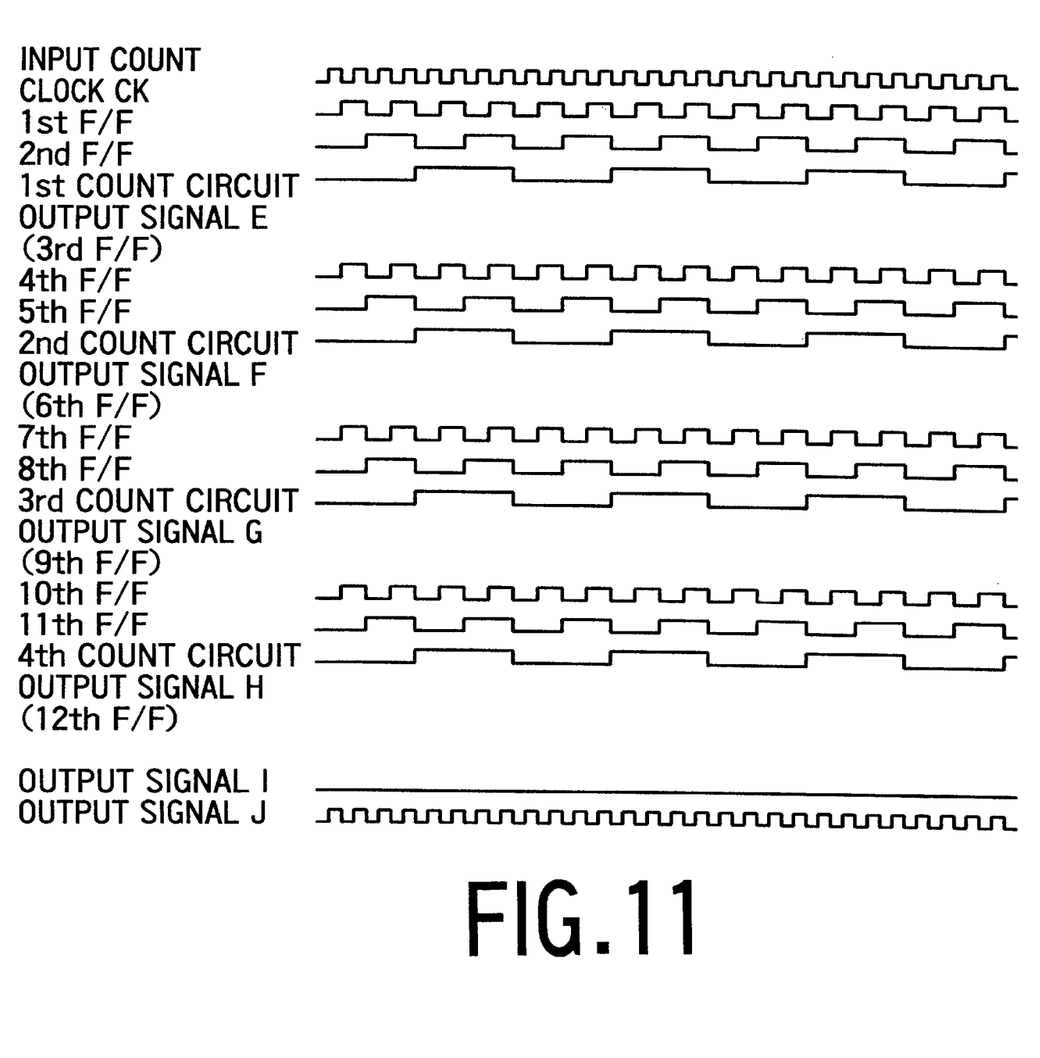
FIG. 11 is a waveform diagram showing various pulses obtained when the circuit device is operating normally in the operation test mode.

Further, without being limited only to the above-mentioned embodiments, the semiconductor integrated circuit device according to the present invention can be modified in various ways. For instance, the counter circuits can be divided into three, four, . . . counter circuits, without being limited only two. FIGS. 9 to 11 show the case where the counter circuit 40 is divided into four. In more detail, FIG. 9 is a block diagram showing the semiconductor integrated circuit device having the counter circuit 10 divided into four, which corresponds to FIG. 2 of the first embodiment. FIG. 10 is a table listing the signal selections in both the operation test mode and the ordinary operation mode of respective selector circuits shown in FIG. 9, respectively. FIG. 11 is a waveform diagram showing pulses at various points.

As understood by FIG. 9, the counter circuit 10 of this semiconductor integrated circuit device is divided into four of a first counter circuit 10a, a second counter circuit 10b, a third counter circuit 10c, and a fourth counter circuit 10d. Further, a first selector circuit (a) 22a is connected between the first counter circuit 10a and the second counter circuit 10b; a first selector circuit (b) 22b is connected between the second counter circuit 10b and the third counter circuit 10c; and a first selector circuit (c) 22c is connected between the third counter circuit 10c and the fourth counter circuit 10d. In summary, three first selector circuits 22a, 22b and 22c are provided in total. Except the above-mentioned point, the semiconductor integrated circuit device shown in FIG. 9 is substantially the same in construction and in operation as with the case of the first and second embodiments, so that any detailed description will be omitted herein.

Figure 11A:
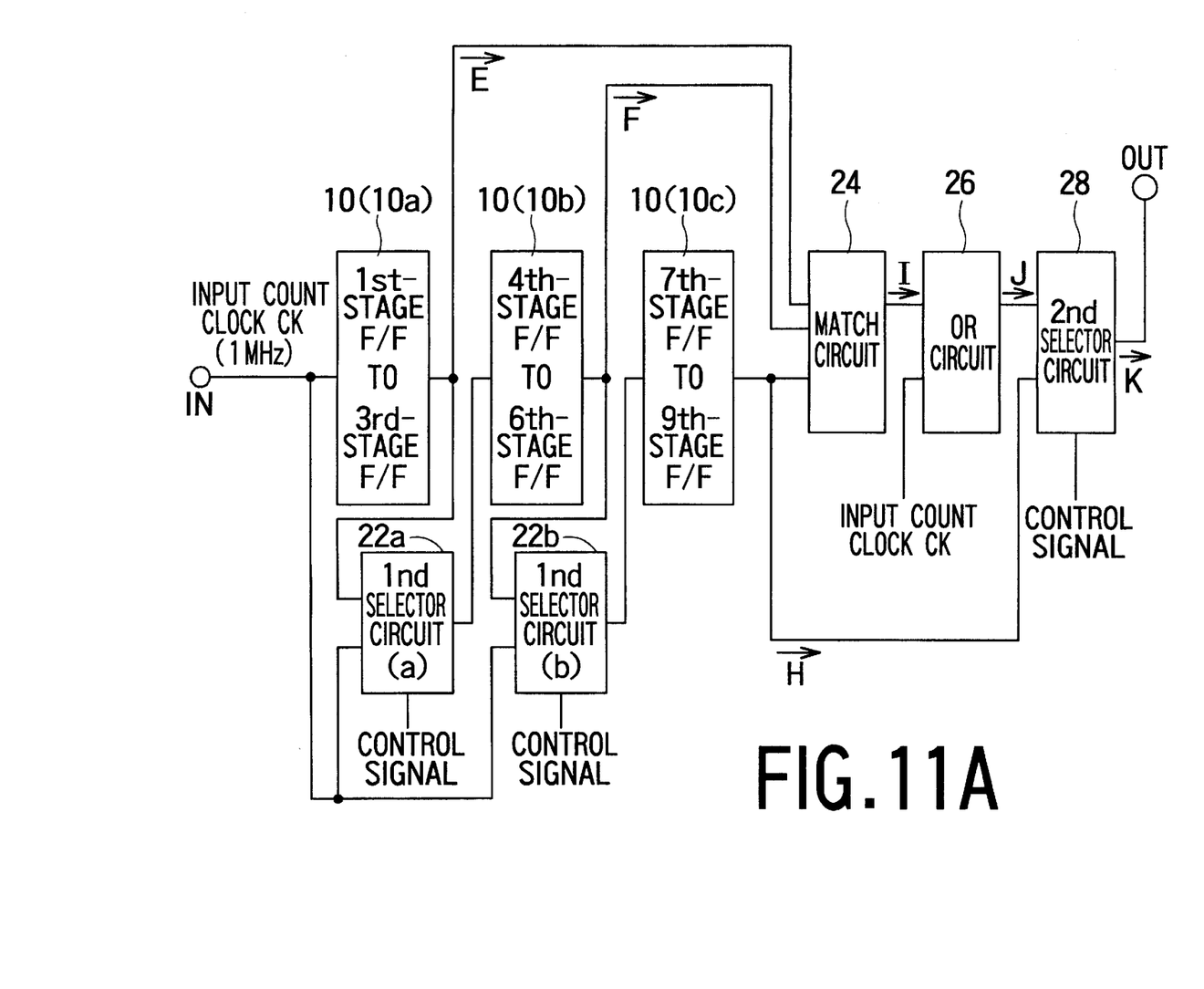
FIG. 11A is a block diagram showing the semiconductor integrated device according to the present invention, in which the counter circuit is divided into three counter circuit units.

Further, FIG. 11A shows the case where the counter circuit is divided into three counter circuit units. As understood by FIG. 11A, when the counter circuit 10 is divided into three of the first counter circuit 10a, the second counter circuit 10b and the third counter circuit 10c, the match circuit 24 detects whether three output signals of the three counter circuits match one another or not.

As described above, in the semiconductor integrated circuit device according to the present invention, the counter circuit composed of a plurality of flip-flops is divided into a plurality of counter circuit units during the operation test. Further, the input count clock CK is inputted to a plurality of the divided counter circuit units at the same time, and the output signals of a plurality of the divided counter circuit units are compared with each other for discrimination of whether the counter circuit is operating under the normal conditions. Therefore, it is possible to shorten the time required for the operation test, to increase the circuit activation ratio, and further to compact the circuit scale.

What is claimed is:

1. A semiconductor integrated circuit device, which comprises:
   a counter circuit composed of a plurality of series-connected flip-flops; and
   a test circuit for dividing said counter circuit into a plurality of counter circuit units during operation test of said counter circuit, inputting an input count clock to each of the divided counter circuit units, and comparing output signals of the divided counter circuit units each of which counts the inputted count clock mutually, to detect whether the output signals thereof match one another.

2. The semiconductor integrated circuit device of claim 1, wherein said test circuit comprises at least one input switching selector circuit responsive to the output signal of the front-stage counter circuit unit and the input count clock, for outputting the output signal of the front-stage counter circuit unit to the rear-stage counter circuit unit during ordinary operation but the input count clock to the rear-stage counter circuit unit during the operation test.

3. The semiconductor integrated circuit device of claim 2, wherein said counter circuit is divided into the two counter circuit units, and the number of said input switching selector circuit is one.

4. The semiconductor integrated circuit device of claim 2, wherein said counter circuit is divided into the three counter circuit units, and the number of said input switching selector circuit is two.

5. The semiconductor integrated circuit device of claim 2, wherein said counter circuit is divided into the four counter circuit units, and the number of said input switching selector circuit is three.

6. The semiconductor integrated circuit device of claim 1, wherein said test circuit comprises a match circuit responsive to the output signals of the respective counter circuit units, for detecting whether the output signals of the respective counter circuit units match one another.

7. The semiconductor integrated circuit device of claim 6, wherein said match circuit is formed by an exclusive OR circuit.

8. The semiconductor integrated circuit device of claim 6, wherein said test circuit comprises a logic circuit responsive to the output signal of said match circuit and the input count clock, for outputting a logical sum of the output signal and the input count clock.

9. The semiconductor integrated circuit device of claim 8, wherein said logic circuit is formed by an OR circuit.

10. The semiconductor integrated circuit device of claim 8, wherein said test circuit comprises an output switching selector circuit responsive to an output signal of said logic circuit and the output signal of said counter circuit, for outputting the output signal of said counter circuit during ordinary operation but outputting the output signal of said logic circuit during operation test.

11. The semiconductor integrated circuit device of claim 1, wherein said counter circuit units comprise the same number of said flip-flops respectively.

12. A semiconductor integrated circuit device, which comprises:

a counter circuit composed of n-units of flip-flops, where n is a positive integer;

dividing means for dividing said counter circuit composed of n-units of the flip-flops into m-units of counter circuit units each composed of a-units of flip-flops during operation test of said counter circuit, where a and m are positive integers; $m \geq 2$; and $n = a \times m$;

inputting means for inputting an input count clock to each of the m-units of the divided counter circuit units substantially at the same time during the operation test of said counter circuit, but the input count clock only to the first-stage counter circuit unit during ordinary operation of said counter circuit; and comparing means for comparing output signals of m-units of the counter circuit units one another during the operation test of said counter circuit.

13. The semiconductor integrated circuit device of claim 12, which further comprises switching means for switching the ordinary operation to the operation test or vice versa.

14. The semiconductor integrated circuit device of claim 13, wherein said dividing means, said inputting means and said switching means are formed by (m−1)-units of input switching selector circuits responsive to an output signal of the front-stage counter circuit unit and the input count clock, for outputting any one of the output signal of the front-stage counter circuit unit and the input count clock to the rear-stage counter circuit unit on the basis of a control signal.

15. The semiconductor integrated circuit device of claim 12, wherein said comparing means is formed by an exclusive OR circuit responsive to the output signals of the counter circuit units.

16. A method of testing a semiconductor integrated circuit device, which comprises the steps of:

dividing a circuit composed of n-units of flip-flops operable as a counter circuit during ordinary operation, into m-units of counter circuit units each composed of a-units of flip-flops during operation test, where n, a and m are positive integers, respectively; $m \geq 2$; and $n = a \times m$;

inputting an input count clock to m-units of the counter unit circuits substantially at the same time; and comparing the output signals of m-units of the counter circuit units one another for operation test of the counter circuit.

17. The method of testing a semiconductor integrated circuit device of claim 16, wherein the ordinary operation is switched to the operation test or vice versa, by inputting a control signal to an input switching selector circuit and an output switching selector circuit.

18. The method of testing a semiconductor integrated circuit device of claim 16, wherein m=2, and the output signals of the two counter circuit units are compared with each other, to decide the counter circuit as being normal when both output signals match but as being abnormal when both mismatch.

19. The method of testing a semiconductor integrated circuit device of claim 16, wherein m=3, and the output signals of the three counter circuit units are compared with one another, to decide the counter circuit as being normal when all output signals match but as being abnormal when all do not match.

20. The method of testing a semiconductor integrated circuit device of claim 16, wherein m=4, and the output signals of the four counter circuit units are compared with one another, to decide the counter circuit as being normal when all output signals match but as being abnormal when all do not match.

* * * * *